United States Patent [19]

Horiguchi et al.

[11] Patent Number: 4,770,953
[45] Date of Patent: Sep. 13, 1988

[54] ALUMINUM NITRIDE SINTERED BODY HAVING CONDUCTIVE METALLIZED LAYER

[75] Inventors: Akihiro Horiguchi, Yokohama; Mituo Kasori; Fumio Ueno, both of Kawasaki; Hideki Sato; Nobuyuki Mizunoya, both of Yokohama; Mitsuyoshi Endo, Yamato; Shun-ichiro Tanaka, Yokohama; Kazuo Shinozaki, Inagi, all of Japan

[73] Assignee: Kabushiki Kaisha Toshiba, Kawasaki, Japan

[21] Appl. No.: 16,557

[22] Filed: Feb. 19, 1987

[30] Foreign Application Priority Data

Feb. 20, 1986 [JP] Japan ................................. 61-33824
Feb. 20, 1986 [JP] Japan ................................. 61-33826
Jul. 23, 1986 [JP] Japan ................................. 61-171914

[51] Int. Cl.$^4$ .................. B32B 9/00; C04B 35/58
[52] U.S. Cl. .......................... 428/698; 428/209; 428/210; 428/699; 428/901; 501/96; 501/152; 174/16 HJ; 361/386
[58] Field of Search ............... 428/209, 210, 698, 699, 428/901; 501/96, 98, 152; 174/16 HS; 361/386, 387

[56] References Cited

U.S. PATENT DOCUMENTS 4,591,537 5/1986 Aldinger et al. ................. 428/698
4,649,070 3/1987 Kondo et al. .................... 428/209
4,659,611 4/1987 Iwase et al. ..................... 428/209

OTHER PUBLICATIONS

N. Kuramoto et al., "Proceedings of the 36th Electronic Components Conference", (IEEE) (1986), pp. 424–429.
Y. Kurakowa et al., "Proceedings of the 36th Electronic Components Conference", (IEEE) (1986), pp. 412–418.

Primary Examiner—John E. Kittle
Attorney, Agent, or Firm—Foley & Lardner, Schwartz, Jeffery, Schwaab, Mack, Blumenthal & Evans

[57] ABSTRACT

For higher thermal conductivity, stronger adhesion strength, excellent insulating characteristics, and multilayer interconnection, an aluminium sintered body for circuit substrates comprises a novel conductive metallized layer on the surface of the sintered body. The metallized layer comprises at least one element selected from the first group of Mo, W and Ta and at least one element selected from the second group of IIa, III, IVa group elements, lanthanide elements, and actinide elements in the periodic table, as the conductive phase element. The first group element serves to improve the heat conductivity and resistance, while the second group serves to increase the wetness and adhesion strength between the insulating body and the metallized layer. Further, the plural insulating ceramic bodies and the plural metallized conductive layers can be sintered simultaneously being stacked one above the other to permit a multilayer interconnection.

19 Claims, 2 Drawing Sheets

AFTER SIMULTANEOUS SINTERING

FIG. 1A
PRIOR ART

PEELING-OFF

FIG. 1B
PRIOR ART

DEFORMATION

ALUMINUM NITRIDE SINTERED BODY HAVING CONDUCTIVE METALLIZED LAYER

BACKGROUND OF THE INVENTION

1. Field of the Invention

The present invention relates to an aluminium nitride sintered body, and more specifically to an aluminium nitride sintered body having a conductive metallized layer with an excellent high-temperature adhesion to the aluminium nitride sintered body base material and available for a semiconductor device substrate.

Furthermore, the present invention relates to a circuit substrate using an aluminium nitride sintered body as an insulating layer, and more particularly to a circuit substrate in which conductive layers are integrally and simultaneously sintered with the insulating layer to realize a multilayer interconnection.

2. Description of the Prior Art

Owing to excellent high insulation characteristics, corrosion resistance, thermal shock, high-temperature strength, thermal radiation, and heat conductivity, aluminium nitride (AlN) sintered bodies have been noticed as various structure materials, various electronic/electric parts materials, etc. Recently, in particular, this AlN sintered body has been used in place of alumina ($Al_2O_3$) and beryllia (BeO), because $Al_2O_3$ is not satisfactory in heat radiation and BeO is poisonous and therefore complicated to handle. When the AlN sintered body is used, the body is usually joined with some metal members, so that a conductive metallized layer is generally formed on the surface of the AlN sintered body.

As a method of forming a metallized layer on the AlN sintered body, there is well known the direct bond copper (DBC) method by which an oxide layer ($Al_2O_3$) is formed on the surface of the sintered body and thereafter copper (Cu) foil is directly bonded or the thick film method of Copper (Cu), gold (Au), silver (Ag)-palladium (Pd).

However, the conductive metallized layer formed on the surface of the AlN sintered body in accordance with the above-mentioned conventional methods is weak in terms of adhesion to the AlN sintered body, in particular at high temperature. Therefore, there exist problems such that it is difficult to bond another member with the formed metallized layer by a high temperature (700° C. or higher) bonding method such as brazing, high temperature soldering, etc. or, even if bonded, when the AlN sintered body to which another member is bonded is used at high temperature, the formed metallized layer peels off the surface of the sintered body and eventually another member is dropped off from the metallized layer. In particular, where the AlN sintered body including a conductive metallized layer is used as a heat radiation substrate for electronic circuits, since the substrate is subjected to temperature changes (heat cycles) from low to high or vice versa, there exists another disadvantage such that cracks develop in the metallized layer due to a difference in thermal expansion coefficient between the AlN and the metallized layer forming component.

This AlN sintered body is manufactured roughly as follows:

An AlN powder is first mixed with a sintering aid such as $Y_2O_3$, $Sm_2O_3$, CaO, etc. of a predetermined amount, and further with an acrylic base resin binder, if necessary as an aid. These are sufficiently mixed, formed into an AlN green sheet body (raw compact) of a predetermined shape under pressure, and sintered at a predetermined temperature within a nitride atmosphere, for instance.

Where the AlN sintered body is used as a substrate for semiconductor devices, it is necessary to further form a conductive film on the surface of this AlN sintered body. Conventionally, this film was a metallized layer of Cu, Au or Ag-Pd formed on the surface of the AlN sintered body in accordance with the DBC (direct bond copper) method or the thick film method.

Figure 1A:
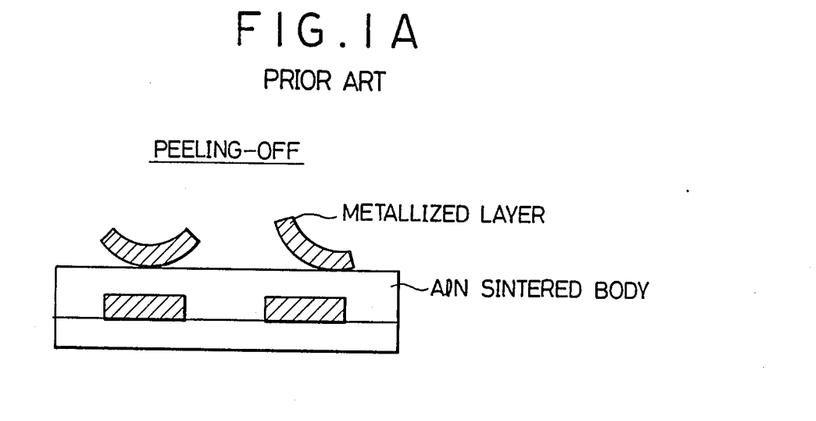
FIG. 1A is an illustration for assistance in explaining peeling-off occurring due to lack of adhesion strength between AlN sintered bodies and metallized layers in a prior art AlN sintered body having conductive metallized layer.

However, these conventional substrates involve the following problems:

The first problem is that the adhesion strength between the metallized layer and the AlN sintered body surface is weak, and therefore peeling occurs between the two as shown in FIG. 1A, thus lowering the substrate reliability, as shown in FIG. 1A.

The second problem occurs when a semiconductor element or wire is brazed or soldered at a high temperature onto the formed metallized layer. That is to say, although brazing is effected at about 800° C. with a hydrogen-nitrogen mixture gas, since the metallized layer baking temperature is as low as about 600° to 1000° C., the adhesion junction strength between the metallized layer and the AlN sintered body surface is lowered markedly in brazing, thus disabling brazing in practice. Further, a similar problem arises in the case of high temperature soldering.

Figure 1B:
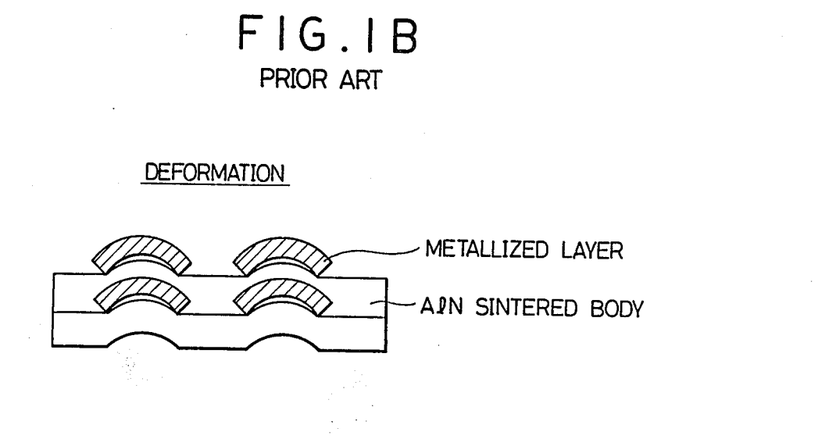
FIG. 1B is an illustration for assistance in explaining peeling-off occurring due to a difference in thermal expansion coefficient and shrinkage coefficient between AlN sintered bodies and metallized layers in the prior art AlN sintered body having conductive metallized layer.

The third problem occurs due to a difference in thermal expansion coefficient between the AlN sintered body and the metallized layer. As is the case of brazing and high temperature soldering, severe heat-cool cycles are applied in use to the substrate on which semiconductor elements such as silicon wafers are mounted. As a result, thermal stresses are generated on junction surfaces between AlN sintered body, metallized layer, brazed layer (or soldered layer), and semiconductor elements due to differences in thermal expansion coefficient between two of these layers, thus resulting in an occurrence of peelings of these elements, as shown in FIG. 1B.

The thermal expansion coefficient of the metallized layer is about 2 to 4 times greater than that (about $4.6 \times 10^{-6}/°C.$) of the AlN sintered body, and roughly equal to or half of that of the brazed or soldered layer. Therefore, since there is a big difference between the AlN sintered body and the metallized layer or the brazed (soldered) layer, microcracks are readily produced on the boundary surface between the AlN sintered body and the metallized layer or the brazed (or soldered) layer during heat cycle. Further, these microcracks develop gradually when the heat cycle is repeated, thus finally causing the peeling-off of the semiconductor element from the sintered body. This problem is serious, in particular, because the reliability of appliances having substrates on which semiconductor elements are mounted will be deteriorated.

The fourth problem is that the adhesion strength between the metallized layer and the AlN sintered body is small at high temperatures, so that the reliability of the substrate is low at high temperature as in the second problem.

Finally, the fifth problem is that thermal energy is not economical when checking the manufacturing processes from the first to the last. In other words, the substrate is completed by first sintering an AlN green body and further sintering the AlN sintered body again to form the metallized layer.

With the advance of miniaturization of electronic appliances, the way heat generated from semiconductor devices mounted on a circuit substrate can effectively be radiated has become an important problem. Further, heat radiation is an important problem when power semiconductor devices are mounted on a circuit substrate.

Conventionally, $AlO_3$ ceramics have widely been adopted as an insulating material for circuit substrates. However, since the $Al_2O_3$ is low in heat conductivity, there still exists a problem with heat radiation. Therefore, application of AlN ceramics excellent in electrical characteristics such as electric insulating characteristics (as an insulator) and in thermal conductivity to circuit substrates has been studied (as disclosed Japanese Published Unexamined Pat. Appl. No. 60-178688).

When taking into account the miniaturization and high densification in electronic appliances, a higher densification is also required for wiring on circuit substrates and therefore a multilayer AlN ceramic substrate has been studied (as disclosed Japanese Published Unexamined Pat. Appl. Nos. 60-253294 and 60-253295). Further, in the $Al_2O_3$ ceramics, although a technique of simultaneously sintering a plurality of laminated green sheets has been established, it is impossible to simply apply the technique for $Al_2O_3$ ceramics to AlN ceramics as it is, because of a difference in fundamental properties between AlN and $Al_2O_3$.

As described above, although the demand for AlN ceramic based multilayer interconnection circuit substrates has increased, since warp, conductive path disconnection, peeling-off, etc. will be produced during the process of simultaneous sintering, the AlN multilayer ceramics is not practical at present.

In summary, with the advance of higher speed, higher densification, and higher output power of semiconductor devices mounted on a substrate, there exists a strong demand for AlN sintered bodies provided with higher heat conductivity, higher adhesion strength, excellent electric characteristics and additionally with multilayer interconnection owing to simultaneous sintering of the AlN bodies and metallized layers.

SUMMARY OF THE INVENTION

With these problems in mind, therefore, it is the object of the present invention to provide an aluminium nitride sintered body having a conductive metallized layer high in adhesion strength particularly at high temperature within a reducing atmosphere and therefore high in adhesion reliability when other members are bonded to the metallized layer by brazing or soldering.

It is another object of the present invention to provide a method of forming a metallized layer on the surface of an AlN green body simultaneously when the AlN green body is sintered, in such a way that the thermal expansion coefficient of the metallized layer approximates that of the AlN sintered body, and the heat resistance and the adhesion strength of the conductive metallized layer are both high.

It is another object of the present invention to provide a circuit substrate using AlN ceramics, which is high in adhesion strength between the conductive layer and the insulating layer, and warp and disconnection resistances, and in particular a circuit substrate having multilayer interconnections attained by simultaneous sintering.

To achieve the above-mentioned objects, an aluminium nitride sintered body according to the present invention comprises: (a) an insulating layer formed by sintering an aluminium nitride body; and (b) a metallized layer formed on said insulating layer, said metallized layer including as component (1) a conductor element; and (2) at least one element selected from the group consisting of IIa, IIIa, IVb, IIIb, lanthanide and actinide group elements in periodic law table.

The insulating layer includes at least one element selected from the group consisting of alkaline earth and rare-earth elements as a sintering aid to enable atmospheric sintering and to increase adhesion strength between said two layers. The conductor is any one of W, Mo, Ta, TiN and ZrN. Further, the content of the sintering aid in the insulating layer is 20 wt.% or less in oxide conversion, preferably 0.05 wt.% or more.

The feature of the present invention exists in combination of the conductor and the component element. Therefore, the ratio of both is not limitative, but selectively determined according to the various objects of improving the adhesion strength between the two layers, the conductivity of the conductor, the deformation of the sintered body in sintering process, and the like.

BRIEF DESCRIPTION OF THE INVENTION

The features and advantages of the aluminium nitride sintered body having a conductive layer according to the present invention will be more clearly appreciated from the following description taken in conjunction with the accompanying tables and drawings.

DETAILED DESCRIPTION OF THE PREFERRED EMBODIMENTS

An embodiment of the aluminium nitride sintered body according to the present invention for providing a stronger adhesion strength comprises a conductive metallized layer on at least a part of an insulating layer of AlN sintered body, the conductive metallized layer including:

(a) at least one element selected from the first group consisting of molybdenum, tungsten and tantalum; and (b) at least one element selected from the second group consisting of IIa group elements, IIIa and IIIb group elements, IVb group elements, rare-earth elements, and actinide elements in periodic law table, as the conductive phase composing component elements.

As described above, the AlN sintered body according to the present invention is characterized by the combination of component elements for composing the phase of the conductive metallized layer formed on the sintered body base material (corresponding to the insulating layer) surface, so that the properties of the AlN sintered body base material itself are not particularly limited.

In the component elements of the conductive metallized layer, the elements belonging to the first group of molybdenum (Mo), tungsten (W) and tantalum (Ta) are excellent in heat resistance and further approximate to the AlN sintered body base material in thermal expansion coefficient, so that these elements serve to improve the heat resistance characteristics and the cyclic heat resistance characteristics.

These elements are included in a filler of the metallized layer as a single element or a combination of two or more elements. In more detail, these elements belonging to the first group exist in the metallized layer in the form of each element, a compound or solid solution including each element, or a mixture of two or more elements selected from the group consisting of these elements, compounds and solid solutions. The compounds are oxides of these elements, nitrides thereof, carbides thereof, acid nitrides thereof, carbonic nitrides thereof, carbonic oxides thereof, carbonic acid nitrides thereof, borides thereof, silicides thereof, etc. In addition to the above-mentioned elements, these compounds can be composite compounds or solid solutions which include at least one of elements belonging to the second group (described later) and/or at least one of elements other than those belonging to the second group.

That is, when taking the case of Mo as the component element, Mo exists in the composed phase of the conductive metallized layer in the form of Mo or Mo-Al solid solution.

Further, in the component elements of the conductive metallized layer, the elements belonging to the second group of the IIa group elements, the IIIa (B, Al, Ga, In, Tl), the IVb group elements (Ti, Zr, Hf), IIIb group elements (Sc, Y,), the rare earth elements (Y, La, Ce, Pr, Nd, Pm, Sm, Eu, Gd, Tb, Dy, Ho, Er, Tm, Yb, Lu) and the actinide elements (Ac, Th, Pa, U, Np, Pu, Am, Cm, Bk, Cf, Es, Fm, Md, No, Lr) are excellent in wetness relative to AlN, so that these elements serve to improve the adhesion between the conductive metallized layer and the AlN sintered body. Further, Al, Ti, Zr, Hf, Y, Ce, Dy, Th, Sm are particularly preferable as the elements belonging to the second group.

In the same way as in the component elements belonging to the first group, these elements belonging to the second group are included in the composed phase of the metallized layer in the form of a single element or a mixture of two or more elements. That is, these elements exist in the metallized layer in the form of each element, a compound or solid solution including each element or a mixture of two or more elements selected from the group consisting of these elements, compounds and solid solutions.

In the case of Ti as the component phase, Ti exists in the composed phase of the conductive metallized layer in the form of TiN, $TiO_2$, etc.

In the present invention, the composition ratio of elements belonging to the first group and those belonging to the second group is not defined specifically. The ratio is appropriately determined according to the kind of elements used or the combination. For instance, it is preferable that the ratio of the sum total of the elements belonging to the first group to that of the elements belonging to the second group is 90/10 to 10/90 in atomic ratio.

The AlN sintered body according to the present invention can be manufactured as follows:

A paste or liquid including elements selected from the first and second groups is applied to a desired surface of the AlN sintered body base material manufactured in the conventional method. In practice, the paste can be obtained by dispersing a single element or compound powder of the above-mentioned elements into an adhesive agent such as ethylcellulose, nitrocellulose, etc. The above raw material powder is a single-element powder of each of the above-mentioned elements or conductive non-organic compounds including each element such as the oxides, nitrides, carbides, silicides, borides, acid nitrides, carbonic nitrides, boric nitrides, silicic nitrides, hydrides, chlorides, fluorides, bromides, iodides, nitrate, nitrite, sulfates, borates, phosphates, phosphites, carbonates, oxalates, chlorates, silicates, hydroxides, ammonium salts, or other inorganic compounds or organic compounds (e.g. alkoxycid, sol-gel, etc.), which can be changed into a conductive material when baked. It is preferable that the elements selected from the first and second groups or the compounds including the elements of 5 wt.% or more in total are included in the paste or the liquid.

Thereafter, the paste or liquid applied on the surface of the AlN sintered body is dried and heat treated to form a metallized layer. The heating temperature is usually 1100° to 1800° C., although it varies with the kind and the combination of the component elements. The treatment gas is nitrogen gas, dry forming gas, wet forming gas, etc. The treatment time is 0.5 to 2 hours, preferably. Where necessary, a plurality of these AlN sintered bodies on each surface of which the paste is applied to form a conductive layer are stacked one above the other for simultaneous sintering so as to provide multilayer interconnections.

Further, in order to bond another member to the AlN sintered body having the conductive metallized layer, Ni plating, for instance, is effected on the conductive metallized layer and then the plating layer is annealed at 600° to 850° C. within a forming gas, before brazing or soldering. Further, it is possible to form an excellent metallized layer on the surface of the AlN sintered body by applying the paste already explained to an AlN green body and then sintering both at the same time.

Figure 2A:
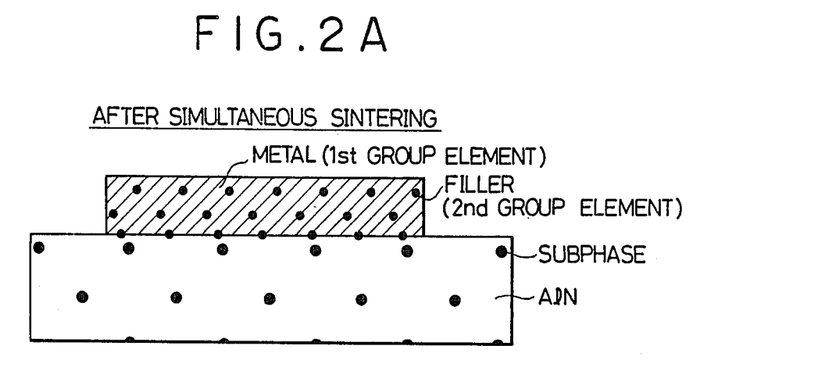
FIG. 2A is an illustration showing an AlN sintered body having a conductive layer according to the present invention in a model form.
Figure 2B:
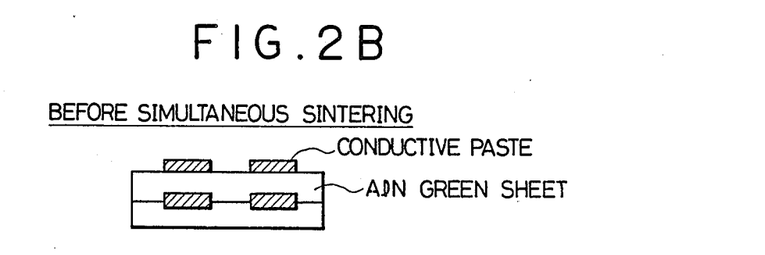
FIG. 2B is an illustration showing two AlN green sheets each having two conductive paste patterns being stacked one above the other before simultaneous sintering.

In more detail, in the method of manufacturing an AlN sintered body including a conductive metallized layer a paste including at least one selected from the first group consisting of molybdenum (Mo), tungsten (W), tantalum (Ta), and compounds having at least one of these elements, and at least one selected from the second group consisting of IIa group elements III group elements in periodic law table, IVb group elements, rare earth elements (the rare earth elements are lanthanum family including Sc and Y), actinide family elements, and compounds including at least one of these elements, is applied to an AlN green sheet body; and the whole is sintered simultaneously. FIG. 2A shows a model in which a conductive metallized layer including a first group metal element and a second group filler element is formed on an AlN sintered body including an assistant by simultaneous sintering. FIG. 2B shows an example in which two AlN green sheets each having two conductive paste layers are stacked one above the other before simultaneous sintering.

First, the AlN green sheet body to which the present invention is applied is a raw compact obtained by mixing AlN powder of predetermined grain size with sintering assistant powder such as $Y_2O_2$, $YF_3$, $Sm_2O_3$, or $CaCO_3$ and a binder such as wax or plastic at a predetermined ratio and by forming the mixture at room temperature under pressure or by forming the mixture into a sheet in accordance with doctor blade method. The grain sizes of the AlN powder and the sintering asistant powder, the mixture ratio of both the powder and the forming pressure, etc. are all appropriately selected under consideration of the characteristics of the AlN sintered body according to the usage.

In the method of the present invention, however, it is preferable to adopt an AlN green sheet body such that the heat conductivity changes to 50 W/m.K or more after having been sintered.

As the method of applying the paste of composition already described to the AlN green sheet body, various known methods such as screen printing, brush application, spin roller application and the like may be adopted.

The paste is composed of two components belonging to two groups I (conductor) and II (component elements) both conversed into a metallized layer after having been sintered and a medium for dispersing these components.

The component belonging to first group I is at least one selected from the group consisting of Mo, W, Ta, compounds including at least one of these elements.

In practice, the component is a single metal of Mo, W, or Ta, these oxides, carbides, borides, silicides, acid nitride, carbon nitrides, hologenides, hydrides, hydroxides, nitrites, nitrates, sulfites sulfates, borates, carbonates, silicates, phosphates, phosphites, hydrochlorides, chlorates, oxalates, salts such as ammonium salt, alkoxycids such as ATRON NTa—700 (Trademark of NIHON SODA Co., Ltd.), organic metal compounds such as sol/gel, and mixtures of two or more of the above components. These components can be used as a single component or a mixture obtained by combining two or more components selected appropriately.

In order to increase the conductivity of the metallized layer to be formed, it is preferable to use each single metal of Mo, W or Ta.

The component belonging to the second group II is at least one selected from the group consisting of III group elements in periodic law table, IVb group elements, rare earth elements (the rare earth elements are lanthanum family including Sc and Y), actinide family elements, and compounds including at least one of these elements.

The III group elements are Al, Ga, In, for instance. In particular, Al is preferable. The IVa group elements are Ti, Zr, Hf, for instance. In particular, Ti is preferable because an excellent metallized layer can be formed irrespective of the kind of the components belonging to the first group I. The rare earth elements are Sc, Y, La, Ce, Pr, Nd, Sm, Gd, etc. In particular, Y and Sm are preferable. The actinide family elements are Ac, Th, etc. However, Ac is preferable, in particular.

In practice, the component belonging to the second group II is a single metal of the III group elements, IVa group elements, rare-earth elements, and actinide family elements, these oxides, nitrides, carbides, borides, silicides, acid nitrides, carbon nitrides, hologenides, hydrides, hydroxides, nitrides, nitrates, sulfites, sulfates, borates, carbonates, silicates, phophates, phosphites, hydrochloride, chlorates, oxalates, salts such as ammonium salt, alkoxycids such as ATRON NTa—700 (Trademark of NIHON SODA Co., Ltd.), organic metal compounds such as sol/gel, and mixtures of two or more of the above components. These components can be used as a single component or a mixture by combining two or more components selected appropriately.

The paste according to the present invention can be prepared by uniformly dispersing the components belonging to two groups I and II into the medium. The medium used is ethylcellulose or nitrocellulose, for instance. The solvent for the medium is terpineol, tetralin, butycarbitol, etc., for instance.

It is considered that the component belonging to the first group I is mainly effective to maintain the conductivity and the heat resistance of the formed metallized layer at a high level and the component belonging to the second group II is effective to maintain the strength of the metallized layer by binding the components belonging to the first group I.

The relationship in quantity between components belonging to groups I and II changes according to the kinds of the selected components. In usual, the component ratio (I/II) by weight of the first group I to the second group II is 1/100 to 10/1.

Further, with respect to the component belonging to the second group II, the weight ratio of I/II is preferably ½ to 2/1 in the IV group elements, but 1/5 to 1/1 in the III group elements.

If the component belonging to the group I is too much as compared with that belonging to the group II, the strength of the formed metallized layer is lowered. In contrast with this, if the component belonging to the group I is too small, the conductivity of the formed metallized layer is unsatisfactory.

The various amounts of the components belonging to the groups I and II in the medium is determined on the basis of the consistency of the prepared paste. If the component belonging to the first group I is too much, the paste becomes viscous, so that it is difficult to uniformly apply the paste on the surface of the AlN green sheet body. In contrast with this, if too little, the paste becomes non-viscous, so that the applied paste drops from the surface of the AlN green sheet body. It is preferable to disperse the component belonging to the first group I to that belonging to the second group II so that a viscosity of the paste lies between 1.0 to $2.5 \times 10^5$ poise.

In the method according to the present invention, after the paste has been applied on the surface of the AlN green sheet body, the whole body is sintered simultaneously. Prior to the above-mentioned simultaneous sintering, it is preferable to effect a degreasing treatment at a temperature from 50° to 700° C., for instance, in order to eliminate the binder component of the AlN green sheet body and the medium of the paste.

The sintering is effected in a nitrogen atmosphere for instance. The sintering temperature and time are determined so that the AlN sintered body has desired characteristics such that the heat conductivity is 50 W/m.K or more. In practice, the sintering temperature is 1600° to 2000° C., preferably 1700° to 1800° C.; the sintering time is 0.2 to 5 hours, preferably 0.5 to 1.5 hours.

As described above, it is possible to form a metallized layer as a conductive thin layer on the AlN sintered body by applying the paste on the surface of the AlN green sheet body.

To confirm the features (heat conductivity, resistivity, adhesion strength, etc.) of the AlN sintered body according to the present invention, various tests have been made in various ways as follows;

(1) FIRST TEST RESULTS

Example 1A

Raw material paste was prepared by mixing modybdenum (Mo) powder, titanium nitride (TiN) powder and ethylcellulose at weight ratio of 8:2:1. The prepared paste was applied on the surface of the AlN sintered body base material including 3 wt.% $Y_2O_3$. The applied paste was dried and heated in $N_2$ gas at about 1700° C. for 1 hour to form a conductive metallized layer. As the result of examination of the obtained conductive metallized layer in accordance with an X-ray diffraction method, Mo, AlN, YAG and TiN were observed as the composition phase.

Next, in order to evaluate the adhesion strength of the conductive metallized layer to the AlN sintered body, Ni was plated on the metallized layer and annealed at about 800° C. in a forming gas. An end of a covar (Ni-Co-Fe alloy) wire was soldered to the metallized layer. The wire was pulled in the direction vertical to the metallized surface to measure the adhesion strength. The measured result was 2 kg/mm$^2$ or more, as shown in Table 1.

Examples 2A to 12A

In the same way as in the Example 1, many AlN sintered bodies having various conductive metallized layers were manufactured by changing the kinds of elements belonging to the first and second groups in various ways. The evaluation results of these examples are listed in the Table 1 in terms of the composition of raw paste material for the metallized layer, the metallized conditions and the resulting layer composition phase.

This table 1 indicates that the AlN sintered body according to the present invention is formed with a conductive metallized layer having a high adhesion strength to the AlN sintered body base material even after a brazing or soldering process. Therefore, if another member is bonded, the reliability is high, so that it is possible to utilize the AlN sintered body according to the present invention for various use. In particular, since the AlN sintered body has a very high heat conductivity (about 5 times higher than that of $Al_2O_3$) and additionally a thermal expansion coefficient very close to that of Si which constitutes semiconductor devices, the AlN sintered body having the conductive metallized layer according to the present invention is usable as semiconductor substrate material.

As described above, since the aluminium nitride sintered body according to the present invention is provided with a conductive metallized layer extremely high in adhesion strength at high temperature to the AlN sintered body base material, it is possible to bond other members to the sintered body by brazing or soldering. In addition, the metallized layer will not be peeled off even if the sintered body to which other members are bonded is used in a heat cycle environment in which temperature changes from low to high or vice versa. Therefore, the AlN sintered body according to the present invention is available for recent high-integration, high-power circuit substrates, ignitors, high-frequency transistors, laser tubes, magnetrons, or various heaters, thus the industrial value is extremely high.

(2) SECOND TEST RESULTS

Example 1B

Mo powder of 0.5 to 1.0 μm in particle diameter was prepared as a component belonging to the group I, and TiN powder of 1.0 to 2.0 μm in particle diameter was prepared as a component belonging to group II. The weight ratio of Mo was 50, and that of TiN was 50. A mixed powder of 100 weight ratio was dispersed into ethylcellulose of 7 weight ratio to obtain a paste of $2.0 \times 10^5$ poise.

The paste prepared as above was applied with a roller on one surface of an AlN green sheet including 3 wt.% $Y_2O_3$ as a sintering assistance to orm a 15 μm thick layer.

The green sheet on which the paste was applied was baked at 700° C. for 180 minutes within a nitrogen atmosphere for degreasing treatment and then sintered at 1800° C. for about 60 minutes in a nitrogen stream.

A metallized layer was formed on the surface of the AlN sintered body. The fact that this metallized layer component phase is Mo and TiN was confirmed by X-ray diffraction method.

Ni plating of about 3 to 5 μm in thickness was formed in accordance with electroless plating technique on the obtained metallized layer. After the plating layer had been annealed at 800° C. in a forming gas, a coval wire (dia: 0.5 mm; tensile strength: 55 kg/mm$^2$) was brazed by use of silver solder. The brazing temperature was 800° C., and the atmosphere was a mixture gas of 50 vol.% hydrogen and 50 vol.% nitrogen.

Thereafter, the AlN sintered body sheet was fixed and then the covar wire was pulled at room temperature (20° C.) to observe the peeled-off resistance of the metallized layer from the sintered sheet. The brazed portion between the metallized layer and the covar wire was broken at a tensile strength of 5 kg/mm$^2$, so that it was proved that the adhesion strength between the two was 5 kg/mm$^2$ or more.

Examples 2B to 5B

Various pastes were prepared by selecting the component belonging to the group I and that belonging to the group II as listed in the Table 2. Each of these pastes was applied to the surface of the AlN green sheet the same as in Example 1B; the green sheets on which the pastes were applied were treated for degreasing and then sintered under the conditions as listed.

The adhesion strength between the metallized layer and the AlN sintered body sheet was measured for each of the sintered body sheets in the same way as in Example 1B. The measured results are listed in Table 2 together.

Comparison 1B:

Each of Au, Cu and Ag-Pd layers was baked on the surface of three AlN sintered sheet with a heat conductivity of 70 to 130 W/m.K in accordance with a thick film method. A copper pin covered by nickel plating was soldered to each of the resulting metallized layers, and then pulled to measure the adhesion strength between the metallized layer and the AlN sintered body sheet. The measured result was about 1 kg/mm$^2$ for all the layers.

Comparison 2B:

A paste of Example 3B was applied to the AlN sintered sheet with a heat conductivity of 70 to 130 W/m.K and baked at 1700° C. A covar pin was brazed to the obtained metallized layer at 700° to 800° C. and pulled. The adhesion strength was 2.0 kg/mm$^2$.

Comparison 3B:

A metallized layer was formed in the same way as in Comparison 2B by the use of the paste of Example 2B. The adhesion strength was roughly equal to that of Comparison 2B.

As described above, the method according to the present invention is high in industrial value as follows: (1) it is possible to form a conductive metallized layer with a high adhesion strength between the layer and the AlN sintered body surface; (2) the formed metallized layer serves to function as a thermal shock layer, because the metallized layer includes a high melting point metal such as Mo, W, Ta and thereby is excellent in heat resistance and approximate to the AlN sintered body in thermal expansion coefficient; and (3) the method is advantageous from a thermal economical standpoint because the applied paste is changed to a metallized layer simultaneously when the AlN green body sheet is sintered.

The AlN sintered body manufactured in accordance with the present invention is applicable to various parts, appliances, etc. such as ignitor, high-frequency transformer, circuit board parts as capacitors, laser insulation tube, power tube insulating cover, high-frequency electromagnetic wave travelling tube window, high-energy beam irradiating window, magnetron member, tube heater, surface heater, sheath heater, soldering iron, iron press plate, moxa cautery appliance, coffee maker heater, trousers presser, hot plate, stool seat, cooking pan, thermal copy printer head, plug, thermo-couple protective tube, crucible scissors end, metal melting crucible, crystal pulling crucible, etc.

Here, an embodiment of the circuit substrate according to the present invention will be described. The present invention provides a circuit substrate formed with an insulating layer including AlN as the main component and at least one element selected from the group consisting of rare earth elements (including Y and lanthanide elements) and alkaline earth elements; and a conductive layer including at least one of a mixture and a compound including alumina and at least one of rare earth elements, and alkaline earth elements in addition to a conductive substance.

The above-mentioned circuit substrate can be obtained by forming a conductive pattern on an AlN green sheet by use of a conductive paste mixed with at least one of the mixture and the compound, before the simultaneous sintering.

In the present invention, since at least one of the mixture and the compound are included in the conductive layer, it is possible to improve the peeling-off resistance of the conductive layer and the warp resistance of the substrate. The conductive substance included in the conductive layer is not particularly limited, if the material is resistant against the AlN ceramic sintering temperature. W, Mo, ZrN, TiN, etc. are preferable. Further, the content of the mixture and/or the compound of alumina and at least one element of rare earth elements and alkaline earth elements is preferably 0.05 to 20 wt.% in oxide conversion in the conductive layer. If the content is too high, the electric conductivity of the conductive layer decreases. If the content is too low, it is impossible to effectively prevent the peeling-off of the conductive layer and the warp of the substrate. The alkaline earth elements and the rare earth elements are preferably Ca, Ba, Sr and Y, La, Ce.

Further, the AlN insulating layer is a sintered body including AlN as the main component and a sintering aid including at least one of rare earth elements (Y and lanthanides) and alkaline earth elements. The rare earth element and/or the alkaline earth element is essential to sinter the AlN layer at atmospheric pressure. However, where AlN ceramics including the rare earth element and the alkaline earth element is used as an insulating body, the afore-mentioned problems such as substrate warp, conductive path disconnection, etc. become noticeable. To solve these problems, the conductive layer as described above is adopted, which results in a multi-layer interconnection ceramic circuit substrate by making the best use of the AlN ceramics including the rare earth element and/or the alkaline earth element. It is preferable that the content of the rare earth element and the alkaline earth element in the insulating layer is 0.01 to 15 wt.% in oxide content. Further, when taking the AlN heat conductivity into account, it is preferable to mix the rare earth element with the alkaline earth element such as Y—Ca, for instance.

The method of manufacturing the circuit substrate according to the present invention will be described hereinbelow. First, an AlN green sheet is formed. To obtain the AlN green sheet, AlN powder, a sintering aid, and a binder are sufficiently mixed together with a solvent, and then the mixture is formed into a sheet in accordance with doctor blade method, for instance. The mean particle size (mean dia.) of the used AlN powder is 5 $\mu$m or less, preferably 4 $\mu$m or less when taking into account the sintering. In practice, the powder of 0.5 to 2 $\mu$m is used. The oxygen concentration in the AlN powder is important, because the heat conductivity is reduced when the content of oxygen is high. Therefore, the content of oxygen in the AlN powder should be 5 wt.% or less, preferably 3 wt.% or less. In practice, the oxygen content is 0.1 to 3 wt.%.

The added sintering aid is a rare earth element and an alkaline earth element such as Sc, Y, La, Ce, Pr, Nd, Sm, Eu, Gd, Dy and Ca, Sr, Mg. These elements contribute to the densification of the AlN ceramics and the high thermal conductivity because oxygen in the AlN powder is trapped by the subphase of the grain boundary. As elements having such an effect as described above, Y, La, Ce, Ca, Sr, Ba are particularly preferable. The sintering aid is added in the form of oxide, carbonate, nitrade, halide, acetylide, carbide, fluoride, hydride, nitride, etc.

Figure 3:
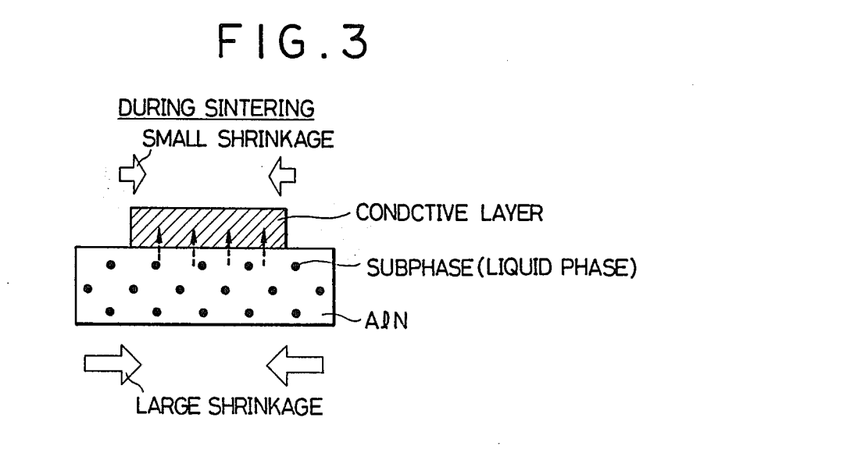
FIG. 3 is an illustration for assistance in explaining a generation of warp due to simultaneous sintering.

Subsequently, the conductive paste sintered into a conductive layer is printed on the AlN layer with a pattern. In this process, via holes are formed in the green sheet to electrically connect two upper and lower conductive layers, each sandwiched by two green sheets. The conductive material in the conductive paste should maintain the electric conductivity even after the simultaneous sintering. The preferable material is W, Mo, ZrN, and TiN. To this conductive paste, at least one of the mixture and/or the compound of alumina and at least one of rare earth elements and alkaline earth elements, are added as a filler. The additive forms an aluminate liquid phase when the AlN sheet is sintered simultaneously. Further, since the AlN ceramics is sintered with liquid phase, an aluminate liquid phase is produced in the insulating layer during sintering. Here, it should be noted that since an aluminate liquid phase is also produced in the conductive layer, the liquid phase in the insulating layer is prevented from being sucked up into the conductive layer in the arrow direction as shown in FIG. 3, and therefore it is possible to prevent the composition of the insulating layer from being made non-uniform due to partial suction of liquid phase, that is, to prevent the circuit substrate from being bent. In this connection, if liquid phase is the insulating layer moves into the conductive layer as shown in FIG. 3, this is not preferable because a difference in shrinkage is produced between the conductive layer and the insulating layer and therefore the wetness is degraded. Further, it is possible to mix the sintering aids (compound) with alumina or else to add a previously formed aluminate in order to form liquid phase in the conductive layer. When a mixture of the aids and alumina is added, it is preferable to mix the two at such a ratio as to form aluminate. That is, the amount of alumina is preferably 0.03 to 10 wt.% so that the aluminate can be formed. Further, it is preferable to use an additive element of the same kind as the AlN ceramic sintering aids.

As described above, it is possible to obtain an AlN ceramic circuit substrate having wiring patterns by simultaneously sintering the green sheets on which conductive paste is applied. The presence of the additive in the conductive layer heightens the adhesion between the conductive layer and the insulating layer and prevents the substrate from being bent during the manufacturing steps.

(3) Third Test Results

Example 1

A raw material of green sheet was prepared by adding a sintering aid of 1.2 μm mean dia. $Y_2O_3$ of 3 wt.% to 1.5 μm mean particle size AlN powder including 1.4 wt.% oxygen an impurity and by wet-blending the two for 24 hours with a ball mill. An organic binder was dispersed into this prepared raw material together with an organic solvent to form a slurry. The slurry was formed into a green sheet with a uniform thickness of 100 to 400 μm in accordance with doctor blade method. The green sheet was cut into an about 130×130 mm square insulating body, and a 300 μm dia. hole was formed to connect electric circuits formed on the insulating layers.

On the other hand, a conductive paste to which filler is added was prepared by mixing 1.1 μm mean particle size tungsten of 97.0 wt.%, 1 μm mean particle size $Al_2O_3$ of 1.288 wt.%, and 1.2 μm mean particle size organic solvent of 1.712 wt.% and by dispersing the mixture.

This tungsten paste to which an inorganic filler had been added was screen-printed on the green sheet in which a via hole had already been formed. A plurality of these were hot pressed to obtain laminated green sheets. The laminated green sheets were treated within a $N_2$ atmosphere to remove the binder, and thereafter sintered at 1800° C. for 1 hour within a $N_2$ atmosphere to obtain a multilayer ceramic substate.

A disc with a diameter of 100 mm and a thickness of 2.5 mm was cut away from part of the obtained substrate at which no conductive portion is included in order to measure the thermal conductivity in accordance with laser flash method with this disc as a test piece.

The parallelism between both sides of the substrate representative of the presence or absence of substrate warp was obtained by measuring a maximum warp value at the center and the peripheral edges of the substrate with the diagonal line of the multilayer sintered body substrate as its standard.

The resistance (m ohm/mm square) of the conductive layer was measured without effecting metal plating to check the effect of inorganic filler addition.

Further, after Ni plating had been effected on a 2×2 mm conductive area of the obtained substrate, a wire was soldered on the Ni plating surface for tensile strength test, that is, the adhesion strength between the Al substrate and the conductive layer was measured. These test results are all listed in Tables 3A, 3B and 4.

Various AlN multilayer ceramic substrates were formed as in the first example 1 by changing the kind of AlN powder, the kind of AlN substrate sintering aid powder, the kind of sintering additive filler, the amount of the above substances, the kind of conductive materials, etc. in various manners. The thermal conductivity, the tensile strength, the parallelism, the surface resistance of conductive layer of each of these Exampls were measured. The test results are listed in Tables 3A, 3B and 4.

These tables indicate that the Examples according to the present invention can improve the adhesion strength between the conductive layer and the substrate. That is to say, the tensile strength is 6.8 kg/2×2 mm in Example 1, but 3.5 kg/2×2 mm in Comparison 1, indicating an insufficient adhesion strength.

In addition, Table 4 indicates that the warp represented by the parallelism between both sides of the substrate is small and further the resistivity is low, in spite of the fact that an additive is included, in the simultaneous sintered body according to the present convention.

As described above, in the aluminium nitride substrate according to the present invention, the thermal conductivity of the insulating body is high; adhesion of the conductive layer is strong; the deformation of the substrate is small during the sintering process; and the surface resistance of conductive layer is low; the tensile strength is high, thus indicating practical and excellent characteristics of the substrates of a high industrial utilization.

TABLE 1

| | METALLIZED LAYER LAW PASTE | | | SINTERING COND | | | | |
|---|---|---|---|---|---|---|---|---|
| | 1st GROUP (wt. RATIO) | 2nd GROUP (wt. RATIO) | MEDIUM (wt. RATIO) | ATM'RE | TEMP (°C.) | TIME (hr) | COMPOSITION PHASE | ADHESION (kg/mm²) |
| EXAMPLE 1A | Mo (80) | TiN (20) | Ethylcellulose (10) | $N_2$ | 1700 | 1 | Mo. TiN | 2 |
| EXAMPLE 2A | Mo (50) | TiN (50) | Ethylcellulose (7) | " | " | " | Mo. TiN | 4 |
| EXAMPLE 3A | Mo (50) | TiN (50) | Ethylcellulose (7) | " | 1800 | " | Mo. TiN | 2 |
| EXAMPLE 4A | $Li_2MoO_4$ (50) | $TiO_2$ (50) | Nitrocellulose (10) | $N_2/H_2$ | 1100 | " | Mo. TiN | 14 |
| EXAMPLE | $Li_2MoO_4$ (60) | $TiO_2$ (40) | Nitrocellulose | " | " | " | Mo. TiN | 10.5 |

TABLE 1-continued

| | METALLIZED LAYER LAW PASTE | | | SINTERING COND | | | COMPOSITION PHASE | ADHESION (kg/mm²) |
|---|---|---|---|---|---|---|---|---|
| | 1st GROUP (wt. RATIO) | 2nd GROUP (wt. RATIO) | MEDIUM (wt. RATIO) | ATM'RE | TEMP (°C.) | TIME (hr) | | |
| 5A | | | (10) | | | | | |
| EXAMPLE 6A | Ammonium-paramolybrate (50) | TiO₂ (50) | Nitrocellulose (10) | " | 1200 | " | Mo. TiN | 6 |
| EXAMPLE 7A | Ammonium-tangstate (50) | TiO₂ (50) | Nitrocellulose (10) | " | 1250 | " | Mo. TiN | 3 |
| EXAMPLE 8A | Mo—W (50) | TiO₂ (50) | Nitrocellulose (10) | " | 1500 | " | Mo. TiN | 4 |
| EXAMPLE 9A | Mo (50) | AlN (50) | Ethylcellulose (7) | N₂ | 1700 | " | Mo. AlN | 3 |
| EXAMPLE 10A | Mo (50) | AlN (50) | Ethylcellulose (7) | " | 1800 | " | Mo. AlN | 4 |
| EXAMPLE 11A | Mo (65) | AlN (35) | Ethylcellulose (7) | " | 1700 | " | Mo. AlN | 4 |
| EXAMPLE 12A | Mo (35) | TiN (65) | Ethylcellulose (7) | " | " | " | Mo. TiN | 5 |

TABLE 2

| | METALLIZED LAYER LAW PASTE | | | | | | SINTERING COND | | HEAT CONDUC'TY (W/m·K) | ADHESION (kg/mm²) |
|---|---|---|---|---|---|---|---|---|---|---|
| | 1st GROUP (wt. RATIO) | | 2nd GROUP (wt. RATIO) | | MEDIUM (wt. RATIO) | | TEMP (°C.) | TIME (hr) | | |
| EXAMPLE 1B | Mo | 50 | TiN | 50 | Ethyl-cellulose | 7 | 1800 | 2 | 70–130 | 3 |
| EXAMPLE 2B | Mo | 50 | AlN | 50 | Ethyl-cellulose | " | " | " | " | 3 |
| EXAMPLE 3B | Mo | 65 | TiN | 35 | Ethyl-cellulose | " | " | " | " | 2 |
| EXAMPLE 4B | Mo | 50 | AlN TiN | 25 25 | Ethyl-cellulose | " | " | " | " | 2 |
| EXAMPLE 5B | — | — | TiN | 100 | Ethyl-cellulose | " | " | " | " | 5 |
| EXAMPLE 6B | W | 65 | AlN | 35 | Ethyl-cellulose | " | " | " | " | 3 |
| EXAMPLE 7B | W | 50 | TiN | 50 | Ethyl-cellulose | " | " | " | " | 5 |
| COMPARISON 1B | Au, Cu, or Ag—Pd baked layer | | | | | | | | | 1 |
| COMPARISON 2B | Mo | 65 | TiN | 35 | Ethyl-cellulose | 7 | 1700 | 2 | 70–130 | 2 |
| COMPARISON 3B | Mo | 50 | AlN | 50 | Ethyl-cellulose | " | 1800 | " | " | 2 |

TABLE 3A

| | INSULATING LAYER | | | | | |
|---|---|---|---|---|---|---|
| | AlN POWDER | | | SINTERING AID | | |
| | MEAN DIA. (μm) | O₂ CONTENT (wt. %) | COMPOSITION (wt. %) | KIND | MEAN DIA. (μm) | COMPOSITION (wt. %) |
| Example 1 | 1.5 | 1.4 | 97.0 | Y₂O₃ | 1.2 | 3.0 |
| Example 2 | 1.5 | 1.4 | 99.0 | Y₂O₃ | 1.2 | 1.0 |
| Example 3 | 1.5 | 1.4 | 95.0 | Y₂O₃ | 1.2 | 5.0 |
| Example 4 | 1.5 | 1.4 | 93.0 | Y₂O₃ | 1.2 | 7.0 |
| Example 5 | 1.5 | 1.4 | 90.0 | Y₂O₃ | 1.2 | 10.0 |
| Example 6 | 1.5 | 1.4 | 97.0 | Y₂O₃ | 1.2 | 3.0 |
| Example 7 | 1.5 | 1.4 | 97.0 | Y₂O₃ | 1.2 | 3.0 |
| Comparison 1 | 1.5 | 1.4 | 97.0 | Y₂O₃ | 1.2 | 3.0 |
| Comparison 2 | 1.5 | 1.4 | 95.0 | Y₂O₃ | 1.2 | 5.0 |
| Example 8 | 2.2 | 2.3 | 99.0 | CaCO₃ | 2.0 | 1.0 |
| Example 9 | 2.2 | 2.3 | 99.0 | CaCO₃ | 2.0 | 1.0 |
| Example 10 | 2.2 | 2.3 | 99.0 | CaCO₃ | 2.0 | 1.0 |
| Example 11 | 2.2 | 2.3 | 99.0 | CaCO₃ | 2.0 | 1.0 |
| Example 12 | 2.2 | 2.3 | 99.0 | CaCO₃ | 2.0 | 1.0 |
| Comparison 3 | 2.2 | 2.3 | 99.0 | CaCO₃ | 2.0 | 1.0 |
| Example 13 | 2.2 | 3.6 | 98.5 | CaO | 2.0 | 1.5 |
| Example 14 | 2.2 | 3.6 | 98.5 | SrO | 2.3 | 1.5 |
| Example 15 | 2.2 | 3.6 | 98.5 | BaO | 2.3 | 1.5 |
| Example 16 | 2.2 | 3.6 | 97.0 | La₂O₃ | 2.5 | 3.0 |
| Example 17 | 1.2 | 1.4 | 98.0 | CeO₂ | 2.5 | 2.0 |
| Example 18 | 1.6 | 1.4 | 97.5 | Pr₆O₁₁ | 2.5 | 2.5 |
| Example 19 | 2.2 | 3.6 | 99.0 | Nd₂O₃ | 2.5 | 1.0 |
| Example 20 | 1.2 | 1.4 | 95.0 | Sm₂O₃ | 2.5 | 5.0 |
| Example 21 | 1.2 | 1.4 | 92.0 | Dy₂O₃ | 2.5 | 8.0 |
| Comparison 4 | 2.2 | 3.6 | 98.5 | CaO | 2.0 | 1.5 |

TABLE 3A-continued

| | INSULATING LAYER | | | | | |
|---|---|---|---|---|---|---|
| | AlN POWDER | | | SINTERING AID | | |
| | MEAN DIA. (μm) | O$_2$ CONTENT (wt. %) | COMPOSITION (wt. %) | KIND | MEAN DIA. (μm) | COMPOSITION (wt. %) |
| Comparison 5 | 2.2 | 3.6 | 98.5 | SrO | 2.3 | 1.5 |
| Comparison 6 | 2.2 | 3.6 | 98.5 | BaO | 2.3 | 1.5 |
| Comparison 7 | 2.2 | 3.6 | 97.0 | La$_2$O$_3$ | 2.5 | 3.0 |
| Comparison 8 | 1.2 | 1.4 | 98.0 | CeO$_2$ | 2.5 | 2.0 |
| Example 22 | 1.5 | 1.4 | 99.0 | SrCo$_3$ | 1.6 | 1.0 |
| Example 23 | 1.5 | 1.4 | 98.0 | Ca(NO$_3$)$_2$ | 2.5 | 2.0 |
| Example 24 | 1.5 | 1.4 | 96.0 | Y(NO$_3$)$_2$ | 2.5 | 4.0 |
| Example 25 | 1.2 | 1.4 | 96.0 | CaF$_2$ | 2.5 | 4.0 |
| Example 26 | 1.6 | 2.4 | 99.0 | SrF$_2$ | 2.5 | 1.0 |
| Example 27 | 1.6 | 2.4 | 92.5 | BaF$_2$ | 2.5 | 7.5 |
| Example 28 | 1.2 | 1.4 | 98.0 | YF$_3$ | 2.5 | 2.0 |
| Example 29 | 1.6 | 2.4 | 92.5 | LaF$_2$ | 2.5 | 7.5 |
| Example 30 | 1.6 | 2.4 | 99.0 | CaC$_2$ | 2.5 | 1.0 |
| Comparison 9 | 1.5 | 1.4 | 98.0 | Ca(NO$_3$)$_2$ | 2.5 | 2.0 |
| Comparison 10 | 1.5 | 1.4 | 96.0 | Y(NO$_3$)$_3$ | 2.5 | 4.0 |
| Comparison 11 | 1.2 | 1.4 | 96.0 | CaF$_2$ | 2.5 | 4.0 |
| Comparison 12 | 1.2 | 1.4 | 98.0 | YF$_3$ | 2.5 | 2.0 |
| Comparison 13 | 1.6 | 2.4 | 99.0 | CaC$_2$ | 2.5 | 1.0 |
| Example 31 | 2.2 | 3.6 | 97.0 | CaCO$_3$ | 2.5 | 1.8 |
| | | | | Y$_2$O$_3$ | 2.5 | 1.2 |
| Example 32 | 4.8 | 3.5 | 94.0 | CaCO$_3$ | 0.8 | 1.5 |
| | | | | BaCO$_3$ | 2.5 | 1.5 |
| | | | | Y$_2$O$_3$ | 2.5 | 3.0 |
| Example 33 | 1.6 | 2.4 | 95.0 | CaCO$_3$ | 1.5 | 1.25 |
| | | | | BaCO$_3$ | 2.5 | 1.25 |
| | | | | Sm$_2$O$_3$ | 2.5 | 1.25 |
| | | | | Dy$_2$O$_3$ | 2.5 | 1.25 |
| Example 34 | 2.2 | 3.6 | 96.0 | CaF$_3$ | 1.5 | 1.0 |
| | | | | YF$_3$ | 1.5 | 3.0 |
| Example 35 | 0.5 | 0.9 | 95.0 | CaF$_2$ | 1.5 | 1.0 |
| | | | | YF$_3$ | 1.0 | 2.0 |
| | | | | LaF$_3$ | 1.5 | 2.0 |
| Example 36 | 2.2 | 3.6 | 97.0 | CaCO$_3$ | 2.5 | 1.8 |
| | | | | Y$_2$O$_3$ | 2.5 | 1.2 |
| Comparison 14 | 2.2 | 3.6 | 97.0 | CaCO$_3$ | 2.5 | 1.8 |
| | | | | Y$_2$O$_3$ | 2.5 | 1.2 |
| Comparison 15 | 2.2 | 3.6 | 96.0 | CaF$_2$ | 1.5 | 1.0 |
| | | | | YF$_3$ | 1.5 | 3.0 |
| Comparison 16 | 2.2 | 3.6 | 94.0 | CaCO$_3$ | 0.8 | 1.5 |
| | | | | BaCO$_3$ | 2.5 | 1.5 |
| | | | | Y$_2$O$_3$ | 2.5 | 3.0 |
| Example 37 | 1.2 | 1.4 | 98.0 | YF$_3$ | 2.5 | 2.0 |
| Example 38 | 2.2 | 2.3 | 99.0 | CaCO$_3$ | 2.0 | 1.0 |
| Example 39 | 1.5 | 1.4 | 98.0 | Ca(NO$_3$)$_2$ | 2.5 | 2.0 |
| Example 40 | 1.5 | 1.4 | 96.0 | Y$_2$O$_3$ | 1.2 | 3.0 |
| | | | | CaCO$_3$ | 0.9 | 1.0 |
| Example 41 | 1.5 | 1.4 | 96.0 | Y$_2$O$_3$ | 1.2 | 3.0 |
| | | | | CaCO$_3$ | 0.9 | 1.0 |
| Example 42 | 1.5 | 1.4 | 96.0 | Y$_2$O$_3$ | 1.2 | 3.0 |
| | | | | CaCO$_3$ | 0.9 | 1.0 |
| Example 43 | 1.5 | 1.4 | 95.0 | Y$_2$O$_3$ | 1.2 | 5.0 |
| Example 44 | 1.5 | 1.4 | 99.5 | Y$_2$O$_3$ | 1.2 | 0.5 |
| Example 45 | 1.5 | 1.4 | 90.0 | Y$_2$O$_3$ | 1.2 | 10.0 |
| Example 46 | 2.2 | 3.6 | 85.0 | Y$_2$O$_3$ | 1.2 | 15.0 |
| Example 47 | 1.5 | 1.4 | 95.0 | La$_2$O$_3$ | 1.1 | 5.0 |
| Example 48 | 1.5 | 1.4 | 95.0 | CeO$_2$ | 1.1 | 5.0 |
| Example 49 | 1.5 | 1.4 | 97.0 | YF$_3$ | 1.8 | 3.0 |
| Example 50 | 1.5 | 1.4 | 99.0 | CaCO$_3$ | 1.1 | 1.0 |
| Example 51 | 1.5 | 1.4 | 98.0 | CaC$_2$ | 1.9 | 2.0 |
| Example 52 | 1.5 | 1.4 | 99.0 | BaCO$_3$ | 1.7 | 1.0 |
| Example 53 | 1.5 | 1.4 | 99.0 | SrCO$_3$ | 1.5 | 1.0 |
| Example 54 | 1.5 | 1.4 | 98.0 | CaH$_2$ | 2.2 | 2.0 |
| Example 55 | 1.5 | 1.4 | 98.0 | Ca$_3$N$_4$ | 3.6 | 2.0 |
| Example 56 | 1.5 | 1.4 | 98.0 | Ca(NO$_3$)$_2$ | 2.5 | 2.0 |
| Example 57 | 1.5 | 1.4 | 98.0 | Ca(NO$_3$)$_2$ | 2.5 | 2.0 |
| Example 58 | 1.5 | 1.4 | 98.0 | Ca(NO$_3$)$_2$ | 2.5 | 2.0 |
| Comparison 17 | 1.5 | 1.4 | 95.0 | Y$_2$O$_3$ | 1.2 | 5.0 |
| Comparison 18 | 1.5 | 1.4 | 95.0 | Y$_2$O$_3$ | 1.2 | 5.0 |
| Comparison 19 | 1.5 | 1.4 | 97.0 | YF$_3$ | 1.8 | 3.0 |
| Comparison 20 | 2.2 | 3.6 | 75.0 | Y$_2$O$_3$ | 1.2 | 25.0 |
| Comparison 21 | 1.5 | 1.4 | 95.0 | Y$_2$O$_3$ | 1.2 | 5.0 |

TABLE 3B

| | CONDUCTIVE LAYER | | | | | |
|---|---|---|---|---|---|---|
| | CONDUCTIVE COMPONENT | | | INORGANIC FILLER | | |
| | KIND | MEAN DIA. ($\mu$m) | COMPOSITION (wt. %) | KIND | MEAN DIA. ($\mu$m) | COMPOSITION (wt. %) |
| Example 1 | W | 1.1 | 97.0 | $Al_2O_3$ | 1.0 | 1.29 |
| | | | | $Y_2O_3$ | 1.2 | 1.71 |
| Example 2 | W | 1.1 | 99.0 | $Al_2O_3$ | 1.0 | 0.43 |
| | | | | $Y_2O_3$ | 1.2 | 0.57 |
| Example 3 | W | 1.1 | 95.0 | $Al_2O_3$ | 1.0 | 1.55 |
| | | | | $Y_2O_3$ | 1.2 | 3.45 |
| Example 4 | W | 1.1 | 93.0 | $Al_2O_3$ | 1.0 | 1.29 |
| | | | | $Y_2O_3$ | 1.2 | 5.71 |
| Example 5 | W | 1.1 | 90.0 | $Al_2O_3$ | 1.0 | 1.84 |
| | | | | $Y_2O_3$ | 1.2 | 8.16 |
| Example 6 | W | 1.1 | 97.0 | $Al_2O_3$ | 1.0 | 0.93 |
| | | | | $Y_2O_3$ | 1.2 | 2.07 |
| Example 7 | W | 1.1 | 97.0 | $Al_2O_3$ | 1.0 | 0.54 |
| | | | | $Y_2O_3$ | 1.2 | 2.46 |
| Comparison 1 | W | 1.1 | 100.0 | — | — | — |
| Comparison 2 | W | 1.1 | 100.0 | — | — | — |
| Example 8 | W | 1.8 | 99.88 | $Al_2O_3$ | 1.0 | 0.08 |
| | | | | $CaCO_3$ | 2.0 | 0.04 |
| Example 9 | W | 1.8 | 98.83 | $Al_2O_3$ | 1.0 | 0.78 |
| | | | | $CaCO_3$ | 2.0 | 0.39 |
| Example 10 | W | 1.8 | 95.32 | $Al_2O_3$ | 1.0 | 3.14 |
| | | | | $CaCO_3$ | 2.0 | 1.54 |
| Example 11 | W | 1.8 | 90.65 | $Al_2O_3$ | 1.0 | 6.27 |
| | | | | $CaCO_3$ | 2.0 | 3.08 |
| Example 12 | W | 1.8 | 88.3 | $Al_2O_3$ | 1.0 | 7.84 |
| | | | | $CaCO_3$ | 2.0 | 3.85 |
| Comparison 3 | W | 1.8 | 100.0 | — | — | — |
| Example 13 | W | 1.2 | 99.0 | $Al_2O_3$ | 1.0 | 0.78 |
| | | | | $CaO$ | 2.0 | 0.22 |
| Example 14 | W | 1.2 | 99.0 | $Al_2O_3$ | 1.0 | 0.50 |
| | | | | $SrO$ | 2.3 | 0.50 |
| Example 15 | W | 1.2 | 99.0 | $Al_2O_3$ | 1.0 | 0.40 |
| | | | | $BaO$ | 2.3 | 0.60 |
| Example 16 | W | 1.2 | 97.0 | $Al_2O_3$ | 1.0 | 0.71 |
| | | | | $La_2O_3$ | 2.5 | 2.29 |
| Example 17 | W | 1.2 | 97.92 | $Al_2O_3$ | 1.0 | 0.48 |
| | | | | $CeO_2$ | 2.5 | 1.60 |
| Example 18 | W | 1.1 | 97.95 | $Al_2O_3$ | 1.0 | 0.47 |
| | | | | $Pr_6O_{11}$ | 2.5 | 1.58 |
| Example 19 | W | 1.1 | 99.0 | $Al_2O_3$ | 1.0 | 0.23 |
| | | | | $Nd_2O_3$ | 2.5 | 0.77 |
| Example 20 | W | 1.1 | 95.0 | $Al_2O_3$ | 1.0 | 1.13 |
| | | | | $Sm_2O_3$ | 2.5 | 3.87 |
| Example 21 | W | 1.1 | 92.0 | $Al_2O_3$ | 1.0 | 1.72 |
| | | | | $Dy_2O_3$ | 2.5 | 6.28 |
| Comparison 4 | W | 1.2 | 100.0 | — | — | — |
| Comparison 5 | W | 1.2 | 100.0 | — | — | — |
| Comparison 6 | W | 1.2 | 100.0 | — | — | — |
| Comparison 7 | W | 1.2 | 100.0 | — | — | — |
| Comparison 8 | W | 1.2 | 100.0 | — | — | — |
| Example 22 | W | 1.1 | 98.78 | $Al_2O_3$ | 1.0 | 0.50 |
| | | | | $SrCO_3$ | 1.6 | 0.72 |
| Example 23 | W | 1.1 | 97.17 | $Al_2O_3$ | 1.0 | 1.57 |
| | | | | $Ca(NO_3)_2$ | 2.5 | 1.26 |
| Example 24 | W | 1.1 | 92.72 | $Al_2O_3$ | 1.0 | 1.72 |
| | | | | $Y(NO_3)_3$ | 2.5 | 5.56 |
| Example 25 | W | 1.1 | 95.66 | $Al_2O_3$ | 1.0 | 3.14 |
| | | | | $CaF_2$ | 2.5 | 1.20 |
| Example 26 | W | 1.1 | 98.89 | $Al_2O_3$ | 1.0 | 0.50 |
| | | | | $SrF_2$ | 2.5 | 0.61 |
| Example 27 | W | 1.1 | 91.85 | $Al_2O_3$ | 1.0 | 3.00 |
| | | | | $BaF_2$ | 2.5 | 5.15 |
| Example 28 | W | 1.1 | 97.67 | $Al_2O_3$ | 1.0 | 0.86 |
| | | | | $YF_3$ | 2.5 | 1.47 |
| Example 29 | W | 1.1 | 91.34 | $Al_2O_3$ | 1.0 | 1.79 |
| | | | | $LaF_2$ | 2.5 | 6.87 |
| Example 30 | W | 1.1 | 98.97 | $Al_2O_3$ | 1.0 | 0.78 |
| | | | | $CaC_2$ | 2.5 | 0.25 |
| Comparison 9 | W | 1.1 | 100.0 | — | — | — |
| Comparison 10 | W | 1.1 | 100.0 | — | — | — |
| Comparison 11 | W | 1.1 | 100.0 | — | — | — |
| Comparison 12 | W | 1.1 | 100.0 | — | — | — |
| Comparison 13 | W | 1.1 | 100.0 | — | — | — |
| Example 31 | W | 1.2 | 95.44 | $Al_2O_3$ | 1.0 | 3.06 |
| | | | | $CaCO_3$ | 2.5 | 0.90 |
| | | | | $Y_2O_3$ | 2.5 | 0.60 |
| Example 32 | W | 1.2 | 90.89 | $Al_2O_3$ | 1.0 | 6.11 |

TABLE 3B-continued

| | CONDUCTIVE LAYER | | | | | |
|---|---|---|---|---|---|---|
| | CONDUCTIVE COMPONENT | | | INORGANIC FILLER | | |
| | KIND | MEAN DIA. ($\mu$m) | COMPOSITION (wt. %) | KIND | MEAN DIA. ($\mu$m) | COMPOSITION (wt. %) |
| | | | | $CaCO_3$ | 0.8 | 0.75 |
| | | | | $BaCO_3$ | 2.5 | 0.75 |
| | | | | $Y_2O_3$ | 2.5 | 1.50 |
| Example 33 | W | 1.2 | 92.39 | $Al_2O_3$ | 1.0 | 5.09 |
| | | | | $CaCO_3$ | 1.5 | 0.63 |
| | | | | $BaCO_3$ | 2.5 | 0.63 |
| | | | | $Sm_2O_3$ | 2.5 | 0.63 |
| | | | | $Dy_2O_3$ | 2.5 | 0.63 |
| Example 34 | W | 1.2 | 92.78 | $Al_2O_3$ | 1.0 | 5.22 |
| | | | | $CaF_2$ | 1.5 | 0.50 |
| | | | | $YF_3$ | 1.5 | 1.50 |
| Example 35 | W | 1.2 | 90.97 | $Al_2O_3$ | 1.0 | 6.53 |
| | | | | $CaF_2$ | 1.5 | 0.50 |
| | | | | $YF_3$ | 1.0 | 1.00 |
| | | | | $LaF_3$ | 1.5 | 1.00 |
| Example 36 | W | 1.2 | 97.37 | $Al_2O_3$ | 1.0 | 1.13 |
| | | | | $Y_2O_3$ | 2.5 | 1.50 |
| Comparison 14 | W | 1.2 | 100.0 | — | — | — |
| Comparison 15 | W | 1.2 | 100.0 | — | — | — |
| Comparison 16 | W | 1.2 | 100.0 | — | — | — |
| Example 37 | W | 1.2 | 97.88 | $Al_2O_3$ | 1.0 | 0.52 |
| | | | | $Y_2O_3$ | 2.5 | 1.60 |
| Example 38 | W | 1.2 | 99.00 | $Al_2O_3$ | 1.0 | 0.44 |
| | | | | $CaO$ | 2.0 | 0.56 |
| Example 39 | W | 1.2 | 98.27 | $Al_2O_3$ | 1.0 | 0.53 |
| | | | | $CaCO_3$ | 2.5 | 1.20 |
| Example 40 | Mo | 1.2 | 97.0 | $Al_2O_3$ | 1.0 | 1.29 |
| | | | | $Y_2O_3$ | 1.2 | 1.71 |
| Example 41 | ZrN | 1.8 | 97.0 | $Al_2O_3$ | 1.0 | 1.29 |
| | | | | $Y_2O_3$ | 1.2 | 1.71 |
| Example 42 | TiN | 1.0 | 97.0 | $Al_2O_3$ | 1.0 | 1.29 |
| | | | | $Y_2O_3$ | 1.2 | 1.71 |
| Example 43 | ZrN | 1.8 | 95.0 | $Al_2O_3$ | 1.0 | 2.14 |
| | | | | $Y_2O_3$ | 1.2 | 2.86 |
| Example 44 | ZrN | 1.8 | 99.0 | $Y_3Al_5O_{12}$ | 1.1 | 1.0 |
| Example 45 | ZrN | 1.8 | 95.0 | $Y_3Al_5O_{12}$ | 1.1 | 5.0 |
| Example 46 | ZrN | 1.8 | 90.0 | $Y_3Al_5O_{12}$ | 1.1 | 10.0 |
| Example 47 | ZrN | 1.8 | 95.0 | $LaAlO_3$ | 1.5 | 5.0 |
| Example 48 | TiN | 1.2 | 94.81 | $Al_2O_3$ | 1.0 | 1.19 |
| | | | | $CeO_2$ | 1.7 | 4.00 |
| Example 49 | TiN | 1.0 | 97.00 | $Al_2O_3$ | 1.0 | 0.933 |
| | | | | $Y_2O_3$ | 1.2 | 2.067 |
| Example 50 | Mo | 1.2 | 98.58 | $Al_2O_3$ | 1.0 | 0.48 |
| | | | | $CaCO_3$ | 1.1 | 0.94 |
| Example 51 | TiN | 1.0 | 98.58 | $Al_2O_3$ | 1.0 | 0.48 |
| | | | | $CaCO_3$ | 1.1 | 0.94 |
| Example 52 | Mo | 1.2 | 98.83 | $Al_2O_3$ | 1.0 | 0.40 |
| | | | | $BaCO_3$ | 1.7 | 0.77 |
| Example 53 | Mo | 1.2 | 98.75 | $Al_2O_3$ | 1.0 | 0.41 |
| | | | | $SrCO_3$ | 1.5 | 0.84 |
| Example 54 | Mo | 1.2 | 99.0 | $CaAl_2O_4$ | 1.8 | 1.0 |
| Example 55 | Mo | 1.2 | 99.0 | $CaAl_2O_4$ | 1.8 | 1.0 |
| Example 56 | Mo | 1.2 | 48.59 | $Al_2O_3$ | 1.0 | 0.47 |
| | TiN | 1.0 | 50.0 | $CaCO_3$ | 1.1 | 0.94 |
| Example 57 | W | 1.2 | 80.0 | $Al_2O_3$ | 1.0 | 0.47 |
| | TiN | 1.0 | 18.6 | $CaCO_3$ | 1.1 | 0.93 |
| Example 58 | W | 1.2 | 40.0 | $Al_2O_3$ | 1.0 | 0.47 |
| | Mo | 1.2 | 40.0 | $CaCO_3$ | 1.1 | 0.93 |
| | TiN | 1.0 | 18.6 | | | |
| Comparison 17 | ZrN | 1.8 | 100.0 | — | — | — |
| Comparison 18 | TiN | 1.0 | 100.0 | — | — | — |
| Comparison 19 | Mo | 1.2 | 100.0 | — | — | — |
| Comparison 20 | TiN | 1.0 | 90.0 | $Y_3Al_5O_{12}$ | 1.1 | 10.0 |
| Comparison 21 | ZrN | 1.8 | 75.0 | $Y_3Al_5O_{12}$ | 1.1 | 25.0 |

TABLE 4

| | SINTERING TEMP. (°C.) | PARALLELISM (mm/diagonal L.) | THERMAL CONDUCTIVITY (W/m · K) | SHEET RESISTIVITY (mohm/1 mm sq.) | TENSILE STRENGTH (kg/2 × 2 mm) |
|---|---|---|---|---|---|
| Example 1 | 1800 | 0.1 | 110 | 22 | 6.8 |
| Example 2 | 1800 | 0.2 | 70 | 21 | 6.2 |
| Example 3 | 1800 | 0.1 | 120 | 24 | 6.0 |
| Example 4 | 1800 | 0.2 | 114 | 26 | 6.1 |

TABLE 4-continued

| | SINTERING TEMP. (°C.) | PARALLELISM (mm/diagonal L.) | THERMAL CONDUCTIVITY (W/m · K) | (mohm/1 mm sq.) | TENSILE STRENGTH (kg/2 × 2 mm) |
|---|---|---|---|---|---|
| Example 5 | 1800 | 0.3 | 108 | 28 | 6.0 |
| Example 6 | 1800 | 0.1 | 110 | 22 | 5.8 |
| Example 7 | 1800 | 0.2 | 110 | 24 | 5.9 |
| Comparison 1 | 1800 | 1.2 | 110 | 23 | 3.5 |
| Comparison 2 | 1800 | 1.4 | 120 | 22 | 3.2 |
| Example 8 | 1800 | 0.3 | 59 | 23 | 6.5 |
| Example 9 | 1800 | 0.2 | 59 | 27 | 6.2 |
| Example 10 | 1800 | 0.2 | 59 | 28 | 5.9 |
| Example 11 | 1800 | 0.3 | 59 | 28 | 5.8 |
| Example 12 | 1800 | 0.4 | 59 | 31 | 5.6 |
| Comparison 3 | 1800 | 0.9 | 59 | 27 | 2.9 |
| Example 13 | 1800 | 0.3 | 69 | 22 | 5.0 |
| Example 14 | 1800 | 0.2 | 67 | 23 | 5.5 |
| Example 15 | 1800 | 0.2 | 68 | 23 | 5.7 |
| Example 16 | 1800 | 0.3 | 60 | 29 | 5.6 |
| Example 17 | 1800 | 0.2 | 88 | 25 | 5.2 |
| Example 18 | 1800 | 0.2 | 68 | 25 | 5.1 |
| Example 19 | 1800 | 0.2 | 70 | 23 | 5.0 |
| Example 20 | 1800 | 0.3 | 94 | 28 | 5.1 |
| Example 21 | 1800 | 0.3 | 90 | 29 | 4.9 |
| | | | | SURFACE RESISTANCE | |
| Comparison 4 | 1800 | 1.2 | 69 | 21 | 2.0 |
| Comparison 5 | 1800 | 1.0 | 67 | 23 | 2.3 |
| Comparison 6 | 1800 | 1.2 | 68 | 22 | 1.9 |
| Comparison 7 | 1800 | 1.4 | 60 | 27 | 2.3 |
| Comparison 8 | 1800 | 1.0 | 88 | 27 | 2.1 |
| Example 22 | 1800 | 0.2 | 95 | 22 | 6.0 |
| Example 23 | 1800 | 0.4 | 105 | 23 | 5.2 |
| Example 24 | 1800 | 0.4 | 110 | 24 | 5.0 |
| Example 25 | 1800 | 0.5 | 90 | 22 | 5.1 |
| Example 26 | 1800 | 0.2 | 83 | 24 | 4.9 |
| Example 27 | 1800 | 0.4 | 86 | 22 | 5.2 |
| Example 28 | 1800 | 0.3 | 97 | 21 | 5.4 |
| Example 29 | 1800 | 0.4 | 85 | 23 | 5.3 |
| Example 30 | 1800 | 0.3 | 80 | 26 | 5.0 |
| Comparison 9 | 1800 | 0.9 | 105 | 22 | 1.5 |
| Comparison 10 | 1800 | 1.2 | 110 | 24 | 1.8 |
| Comparison 11 | 1800 | 1.0 | 90 | 23 | 1.5 |
| Comparison 12 | 1800 | 1.5 | 97 | 22 | 2.0 |
| Comparison 13 | 1800 | 1.9 | 80 | 24 | 0.5 |
| Example 31 | 1750 | 0.1 | 82 | 25 | 6.1 |
| Example 32 | 1750 | 0.2 | 79 | 28 | 5.8 |
| Example 33 | 1700 | 0.2 | 84 | 27 | 6.0 |
| Example 34 | 1700 | 0.3 | 79 | 27 | 5.3 |
| Example 35 | 1650 | 0.3 | 130 | 28 | 5.0 |
| Example 36 | 1700 | 0.2 | 80 | 23 | 5.1 |
| Comparison 14 | 1750 | 0.7 | 82 | 24 | 1.9 |
| Comparison 15 | 1700 | 0.8 | 79 | 28 | 1.0 |
| Comparison 16 | 1750 | 0.9 | 79 | 26 | 1.8 |
| Example 37 | 1800 | 0.2 | 97 | 23 | 5.0 |
| Example 38 | 1800 | 0.2 | 59 | 21 | 5.2 |
| Example 39 | 1800 | 0.2 | 105 | 23 | 5.0 |
| Example 40 | 1680 | 0.2 | 110 | 21 | 5.5 |
| Example 41 | 1800 | 0.4 | 108 | 25 | 6.8 |
| Example 42 | 1800 | 0.2 | 115 | 28 | 6.5 |
| Example 43 | 1800 | 0.2 | 132 | 22 | 7.1 |
| Example 44 | 1800 | 0.3 | 95 | 25 | 5.2 |
| Example 45 | 1800 | 0.3 | 98 | 21 | 6.0 |
| Example 46 | 1800 | 0.3 | 75 | 22 | 5.2 |
| Example 47 | 1800 | 0.2 | 110 | 24 | 5.5 |
| Example 48 | 1800 | 0.1 | 98 | 20 | 6.5 |
| Example 49 | 1700 | 0.2 | 125 | 21 | 5.9 |
| Example 50 | 1700 | 0.2 | 101 | 22 | 6.0 |
| Example 51 | 1800 | 0.4 | 120 | 21 | 5.8 |
| Example 52 | 1800 | 0.4 | 90 | 25 | 5.3 |
| Example 53 | 1800 | 0.2 | 95 | 24 | 6.2 |
| Example 54 | 1700 | 0.3 | 126 | 22 | 6.1 |
| Example 55 | 1700 | 0.2 | 125 | 20 | 5.9 |
| Example 56 | 1700 | 0.4 | 108 | 19 | 6.5 |
| Example 57 | 1800 | 0.2 | 110 | 20 | 6.9 |
| Example 58 | 1800 | 0.2 | 115 | 19 | 6.8 |
| Comparison 17 | 1800 | 1.4 | 132 | 25 | 3.8 |
| Comparison 18 | 1800 | 1.4 | 135 | 22 | 3.5 |
| Comparison 19 | 1700 | 1.6 | 128 | 25 | 3.6 |
| Comparison 20 | 1800 | 0.2 | 56 | 28 | 5.1 |
| Comparison 21 | 1800 | 0.6 | 130 | 68 | 6.5 |

We claim:

1. An aluminum nitride sintered body, comprising:
   (a) an insulating layer including at least one element selected from the group consisting of alkaline earth and rare earth group elements as sintering aids and formed by sintering an aluminum nitride body; and
   (b) a metallized layer formed on said insulating layer, said metallized layer including:
      (1) a conductive element; and
      (2) at least one component element selected from the group consisting of IIa, IIIa, IVa, IIIb, lanthanide actinide group elements in periodic law table.

2. The aluminium nitride sintered body as set forth in claim 1, wherein said aluminium nitride sintered body is used for a circuit substrate.

3. The aluminium nitride sintered body as set forth in claim 2, wherein said conductive element is at least one element selected from the group consisting of W, Mo, TiN and ZrN.

4. The aluminium nitride sintered body as set forth in claim 2, wherein said at least one component element is any one of a mixture and a compound of alumina and at least one of rare-earth elements and alkaline-earth elements.

5. The aluminium nitride sintered body as set forth in claim 1, wherein said conductive element is at least one element selected from the group consisting of Mo, W and Ta; and
   said at least one component element is at least one element selected from the group consisting of IIIa, IIIb, IVa and actinide group elements.

6. The aluminium nitride sintered body as set forth in claim 1, wherein said insulating layer and said metallized layer are sintered simultaneously.

7. A circuit substrate comprising:
   (a) an insulating layer including at least one element selected from the group consisting of alkaline earth and rare earth group elements as sintering aids and formed by sintering an aluminum nitride body; and
   (b) a conductive layer formed on said insulating layer, said conductive layer including:
      (1) a conductive substance; and
      (2) at least one of a mixture and a compound including alumina and at least one of rare-earth and alkaline-earth elements.

8. The circuit substrate as set forth in claim 7, wherein said conductive substance is at least one element selected from the group consisting of W, Mo, TiN and ZrN.

9. The circuit substrate as set forth in claim 7, wherein said insulating layer and said conductive layer are sintered simultaneously.

10. The circuit substrate as set forth in claim 9, where said conductive layer is a multilayer.

11. The circuit substrate as set forth in claim 7, wherein the content of the mixture and/or the compound is 0.05 to 20 wt.% in oxide conversion in said conductive layer.

12. The circuit substrate as set forth in claim 7, wherein the content of the rare-earth element and the alkaline-earth element is 0.01 to 15 wt.% in oxide conversion in said conductive layer.

13. The circuit substrate as set forth in claim 7, wherein said insulating layer includes aluminium nitride and a sintering aid.

14. The circuit substrate as set forth in claim 13, wherein said sintering aid is at least one of elements selected from the group consisting of Y, La, Ce, Ca, Sr, and Ba.

15. The circuit substrate as set forth in claim 13, wherein the rare-earth or alkaline-earth elements included in said conductive layer are the same as the sintering aid elements included in said insulating layer.

16. The circuit substrate as set forth in claim 14, where the rare-earth or alkaline-earth element included in said conductive layer is at least one of Y, La, Ce, Ca, Sr, and Ba.

17. An aluminum nitride sintered body as claimed in claim 1, wherein (b) (2) is selected from the group consisting of aluminum, titanium, zirconium, hafnium, yttrium, cerium, dysprosium, thorium, and samarium.

18. An aluminum nitride sintered body as claimed in claim 1, wherein (b) (2) is selected from the group consisting of aluminum, titanium, yttrium, cerium, samarium, and actinide.

19. An aluminum nitride sintered body as claimed in claim 18, wherein the conductive substance is selected from the group consisting of molybdenum, tungsten, and tantalum.

* * * * *